United States Patent
Kao et al.

(10) Patent No.: US 6,688,017 B2
(45) Date of Patent: Feb. 10, 2004

(54) METHOD AND APPARATUS FOR ALIGNING AN EXTRACTION ELECTRODE TO AN ARC CHAMBER

(75) Inventors: Tai-Kun Kao, Hsinchu (TW); Kuo-I Huang, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/152,479

(22) Filed: May 21, 2002

(65) Prior Publication Data
US 2003/0217474 A1 Nov. 27, 2003

(51) Int. Cl.$^7$ ............................ G01D 21/00; G01B 5/25
(52) U.S. Cl. ...................... 33/645; 33/563; 33/501.45; 250/491.1
(58) Field of Search .................... 33/645, 562, 563, 33/566, 567, 613, 533, 501.45, 520, 644, 679.1; D10/64; 250/491.1, 492.21; 445/3, 63; 324/765, 601

(56) References Cited

U.S. PATENT DOCUMENTS

| | | | | |
|---|---|---|---|---|
| 1,380,187 A | * | 5/1921 | Brose ........................... | 33/562 |
| 1,558,678 A | * | 10/1925 | Koenig ......................... | 33/567 |
| 1,624,150 A | * | 4/1927 | Scherer ........................ | 33/562 |
| 1,827,375 A | * | 10/1931 | Schneider ..................... | 33/562 |
| 2,834,522 A | * | 5/1958 | Ogle ............................ | 223/34 |
| 4,714,834 A | * | 12/1987 | Shubaly ....................... | 250/427 |
| D294,470 S | * | 3/1988 | Jordan .......................... | D10/64 |
| 5,420,415 A | * | 5/1995 | Trueira ................... | 250/492.21 |

* cited by examiner

Primary Examiner—Diego Gutierrez
Assistant Examiner—R. Alexander Smith
(74) Attorney, Agent, or Firm—Tung & Associates

(57) ABSTRACT

A method for aligning an extraction electrode to an arc chamber of an ion implantation apparatus can be carried out by first providing a calibration tool that is shaped essentially of a flat key that has sections of different widths. The extraction electrode can then be tilted by switching on a tilt motor, while being moved horizontally by switching on an alignment motor until the calibration tool can be smoothly inserted into the slit openings in the arc chamber and in the extraction electrode. The tilt motor and the alignment motor are controlled by a tilt/align controller. When such insertion is not possible, the extraction electrode can be continuously tilted and moved horizontally until such smooth insertion is possible. The present invention further discloses a calibration tool that can be used easily for aligning an extraction electrode to an arc chamber of an ion implantation apparatus.

13 Claims, 3 Drawing Sheets

METHOD AND APPARATUS FOR ALIGNING AN EXTRACTION ELECTRODE TO AN ARC CHAMBER

FIELD OF THE INVENTION

The present invention generally relates to a method and apparatus for aligning an extraction electrode to an arc chamber of an ion implantation apparatus and more particularly, relates to a method and apparatus for aligning an extraction electrode to an arc chamber of an ion implantation machine by utilizing a simple calibration tool for aligning the slit openings of the electrode to the chamber.

BACKGROUND OF THE INVENTION

Semiconductor fabrication processes often use a high current ion implantation machine to implant impurity ions into semiconductor substrates in order to form doped regions, such as sources and drains. The ion implanter delivers a beam of ions of a particular type and energy to the surface of a silicon substrate. Such machines typically include an ion source supply, normally a gas source, and an ion source power supply which is connected to an ion source head. A small quantity of the gas is passed through a vaporizer oven and then into an arc chamber which includes a heated filament, and an anti-cathode. The filament is directly heated by passing electric current through it, derived from the power supply. This heating causes thermionic emission of electrons from the surface of the filament.

An electric field, typically 30 to 150 volts is applied between the filament and the arc chamber walls using the power supply. The field accelerates the electrons in the filament area to the arc chamber walls. A magnetic field is then introduced perpendicular to the electric field to cause the electrons to spiral outward, increasing the path length and chances for collisions with the gas molecules. The collisions break apart many of the molecules and ionize the resultant atoms and molecules by knocking outer shell electrons out of place. As charged particles, these atomic or molecular ions can now be controlled by magnetic and/or electric fields.

Source magnets are employed to change the ion path from a straight path to a helicoid path. With one or more electrons missing, the particles carry a net positive charge. An extraction electrode (anti-cathode) placed in proximity to a slit and held at a negative potential attracts and accelerates the charged particles out of the chamber through the slit opening in the top of the chamber. Ions exiting the chamber are passed through an acceleration tube where they are accelerated to the implantation energy as they move from high voltage to ground. The accelerated ions form a beam well collimated by a set of apertures. The ion beam is then scattered over the surface of a wafer using electrostatic deflection plates.

After operation over a period of time, the processing of gasses in the arc chamber results in the accumulation of materials deposited from the gas, causing the formation of a conductive coating on the filament, chamber walls and anti-cathode. This coating eventually flakes, causing the filament to short out such that it can no longer produce electrons and the implantation machine becomes inoperable. This shorting phenomena is a result of arc-outs and typically occurs during boron implanting. When the arc chamber shorts out, it is necessary to clean the chamber, the anti-cathode and filament, which is a time consuming procedure since the machine is operated at a high vacuum pressure. This procedure is not only time consuming and costly, but the machine down time reduces throughput.

After the chamber and the chamber components such as the extraction electrode are cleaned, the components are put back into the chamber and an alignment process must be performed before the implanter can be put back into operation. Conventionally, the alignment process cannot be carried out under off-line conditions. It is difficult to control the tilt/align action of an extraction electrode by controlling the tilt/align motor controls located on a source control panel of the equipment. The calibration operation requires two technicians with one operating the control switches on the panel and the other observing the reaction of the electrode. Furthermore, the relative position of the slit opening in the extraction electrode and the slit opening in the arc chamber can only be observed by human eyes. It is difficult to identify whether the ion beam is aligned, thus causing a variety of mis-alignment problems. For instance, the same beam current may be generated by relatively higher arc current, rather than by the calibrated current. This leads to a shorter lifetime of the source head and also mis-alignment. Another problems caused is the high extraction current incurred and that the source chamber can be heavily coated with contaminants which reduces the cycle time for preventive maintenance as well as the available machine up-time. Other problems caused are the low quality beam current, out-of-specification monitoring and possibly extraction arcing.

A typical hot cathode penning discharge ion source 10 is shown in FIG. 1. The ion source 10 is constructed by an arc chamber 12, an extraction electrode 14 for the extraction of an ion beam 16, an ion source magnet power supply 18, deceleration power supply 20, extraction power supply 22, filament power supply 24, arc power supply 26 and vaporizer 28.

It is therefore an object of the present invention to provide a method for aligning an extraction electrode to an arc chamber of an ion implantation apparatus that does not have the drawbacks or the shortcomings of the conventional methods.

It is another object of the present invention to provide a method for aligning an extraction electrode to an arc chamber of an ion implantation apparatus by utilizing a simple mechanical calibration tool.

It is a further object of the present invention to provide a method for aligning an extraction electrode to an arc chamber of an ion implantation apparatus which can be carried out by a single technician.

It is another further object of the present invention to provide a method for aligning an extraction electrode to an arc chamber of an ion implantation apparatus by utilizing a calibration tool and a tilt/align controller.

It is still another object of the present invention to provide a method for aligning an extraction electrode to an arc chamber of an ion implantation apparatus by inserting a calibration tool into the slit openings in the extraction electrode and in the arc chamber.

It is yet another object of the present invention to provide a calibration tool for aligning an extraction electrode to an arc chamber of an ion implantation apparatus that is a simple mechanical tool in the shape of a flat key.

It is still another further object of the present invention to provide a calibration tool for aligning an extraction electrode to an arc chamber of an ion implantation apparatus which has the shape of a flat key with a base portion of a larger width and a tip portion of a smaller width.

SUMMARY OF THE INVENTION

In accordance with the present invention, a method and an apparatus for aligning an extraction electrode to an arc chamber of an ion implantation apparatus are provided.

In a preferred embodiment, a method for aligning an extraction electrode to an arc chamber of an ion implantation apparatus can be carried out by the operating steps of providing a calibration tool in the shape of a flat key having at least two reducing, stepped width from a base portion toward a tip portion of the key, the tip portion has a smaller width adapted for intimately engaging a slit opening in the arc chamber, while the base portion has a larger width adapted for intimately engaging a slit opening in the extraction electrode; tilting the extraction electrode and moving the extraction electrode horizontally by a tilt motor and an alignment motor, respectively; the tilt motor and alignment motor are controlled by a tilt/align controller; and inserting the calibration tool into the slit opening of the arc chamber through the slit opening of the extraction electrode, or repeating the steps until the insertion can be made.

The method for aligning an extraction electrode to an arc chamber of an ion implantation apparatus may further include the step of inserting the calibration tool through at least two slit openings in the extraction electrode, or the step of inserting the calibration tool through three slit openings in the extraction electrode. The method may further include the step of fabricating the calibration tool of a rigid plastic or metal, or fabricating the calibration tool of aluminum. The method may further include the step of fabricating the calibration tool in such a dimension that a width of a portion of the key is at least 0.3 mm smaller than a width of a corresponding slit opening that the portion of key is to be inserted, or the step of fabricating the calibration tool in such a dimension that a width of a portion of the key is about 0.5 mm smaller than a width of a corresponding slit opening that the portion of the key is to be inserted.

The present invention is further directed to a calibration tool for aligning an extraction electrode to an arc chamber of an ion implantation apparatus which includes a body in the shape of a flat key that has at least two reducing, stepped widths toward a tip portion of the key, the body further includes a base portion that has a larger width adapted for intimately engaging a slit opening in the extraction electrode; and a tip portion that has a smaller width adapted for intimately engaging a slit opening in the arc chamber.

In the calibration tool for aligning an extraction electrode to an arc chamber of an ion implantation apparatus, a width of the base portion is at least 0.3 mm smaller than a width of a corresponding slit opening in the extraction electrode. A width of the base portion may be about 0.5 mm smaller than a width of a corresponding slit opening in the extraction electrode. A width of the tip portion may be at least 0.3 mm smaller, and preferably about 0.5 mm smaller than a width of a corresponding slit opening in the arc chamber. The calibration tool may be fabricated of a rigid plastic or metal, or may be fabricated of aluminum.

BRIEF DESCRIPTION OF THE DRAWINGS

These and other objects, features and advantages of the invention will become apparent from the following detailed option and the appended drawings in which.

DETAILED DESCRIPTION OF THE PREFERRED EMBODIMENT

Figure 1:
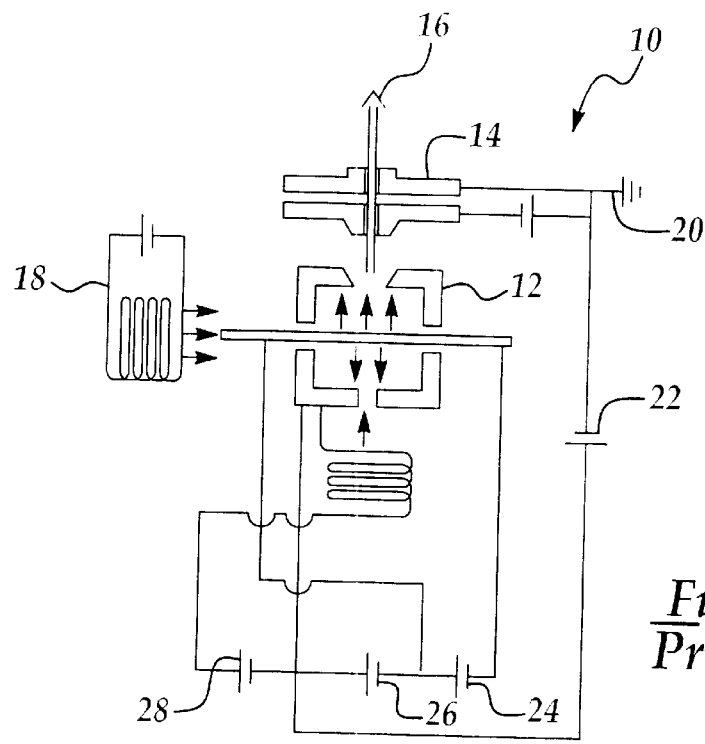
FIG. 1 is an illustration of a conventional hot cathode penning discharge ion source.

The present invention discloses a method for aligning an extraction electrode to an arc chamber of an ion implantation apparatus which consists of four major steps. In the first step, a calibration tool in the shape of a flat key is provided. The calibration tool has at least two reducing, stepped width from a base portion toward a tip portion wherein the tip portion has a smaller width adapted for engaging a slit opening in the arc chamber, while the base portion has a larger width adapted for engaging a slit opening in the extraction electrode. The alignment then proceeds with the steps of first tilting the extraction electrode by switching on a tilt motor, and then moving the extraction electrode horizontally by switching on an alignment motor. The two motors are controlled by a single tilt/align controller. The calibration tool is then inserted into the slit opening of the arc chamber through the slit opening of the extraction electrode. If the insertion is not possible, the tilting and the moving steps are repeated until such insertion can be made.

The invention further discloses a calibration tool for use in aligning an extraction electrode to an arc chamber of an ion implantation apparatus which includes a body in the shape of a flat key that has at least two reducing, stepped width toward a tip portion of the key. The body portion further includes a base portion and a tip portion, wherein the base portion has a larger width adapted for engaging a slit opening in the extraction electrode and the tip portion has a smaller width adapted for engaging a slit opening in the arc chamber. To facilitate the insertion of the calibration tool into the slit openings of the extraction electrode and the arc chamber, the width of the base portion or the tip portion is at least 0.3 mm smaller than a width of the corresponding slit opening into which the tool is inserted. Preferably, the width of the tip portion or the base portion, should be about 0.5 mm smaller than a width of a corresponding slit opening in the extraction electrode or in the arc chamber.

According to the present invention, an actuator is designed for controlling the tilt/alignment action of the extraction electrode. Three separate switches are provided on the actuator, i.e. a power switch, a tilt switch and an alignment switch. When the actuator is used in conjunction with the calibration tool, the alignment of the extraction electrode to the arc chamber can be efficiently executed with high accuracy by a single technician.

Numerous problems are solved by the present invention novel apparatus and method for aligning an extraction electrode to an arc chamber in an ion implantation apparatus. For instance, by utilizing the present invention novel calibration tool, the calibration or alignment process can be carried out under off-line conditions. The calibration procedure can be carried out by a single technician. By accurately positioning the extraction electrode in relation to the arc chamber slit opening, the following advantages can further be achieved: 1. A relatively lower arc current for obtaining beam current is used which can extend the lifetime of the source head; 2. By reducing the extraction current, the source chamber does not get coated by contaminants and therefore the cycle time of preventative maintenance can be increased, i.e. extended from 7 days to over 10 days; 3. The beam current can be achieved of higher quality; 4. The possibility of extraction arcing events can be greatly reduced.

Figure 2:
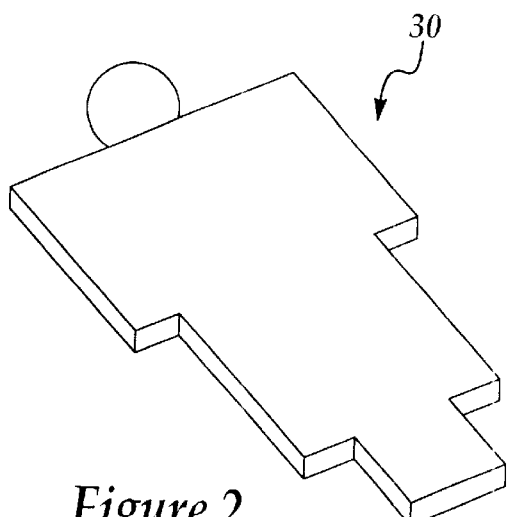
FIG. 2 is a perspective view of the present invention ration tool.
Figure 3:
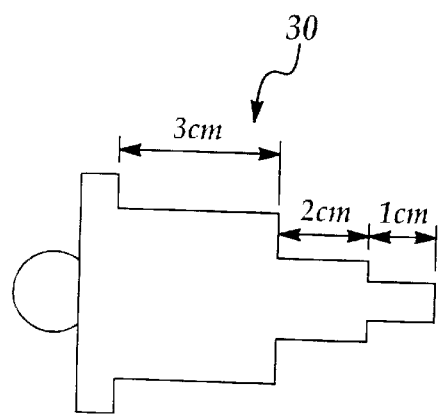
FIG. 3 is a plane view of the present invention ration tool.

Referring now to FIG. 2, wherein a present invention calibration tool 30 is shown. The calibration tool 30 is constructed in a flat key shape from a rigid plastic or metal material. FIG. 3 shows a plane view of the calibration tool 30. A suitable dimension for the calibration tool 30 is a total length of approximately 6 cm, wherein the length for the widest section is about 3 cm, the length for the second widest section is about 2 cm, and the length for the narrowest section is about 1 cm. The thickness of the calibration tool 30 is about 2 mm. In a preferred embodiment, the calibration tool 30 is formed of aluminum for its low weight and rigidity. The width of the various sections of the tool 30 should be at least 0.3 mm smaller than a width of a corresponding slit opening that the specific section of the key is to be inserted. The width of the key, preferably should be about 0.5 mm smaller than a width of the corresponding slit opening that the key is to be inserted.

Figure 4:
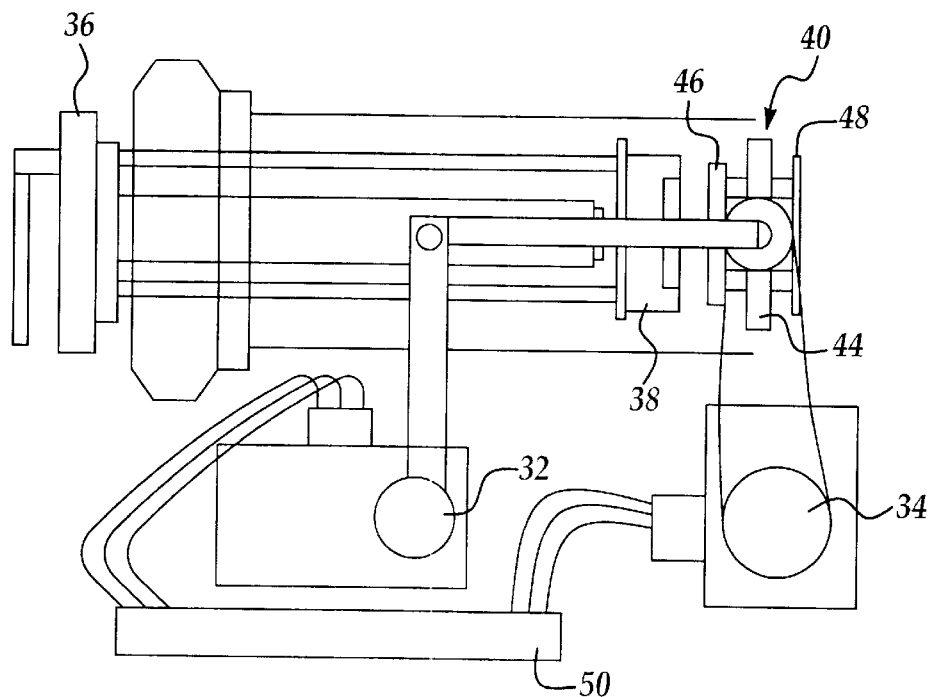
FIG. 4 is an illustration of the present invention d of using a tilt/align controller for aligning an extraction ode.
Figure 5:
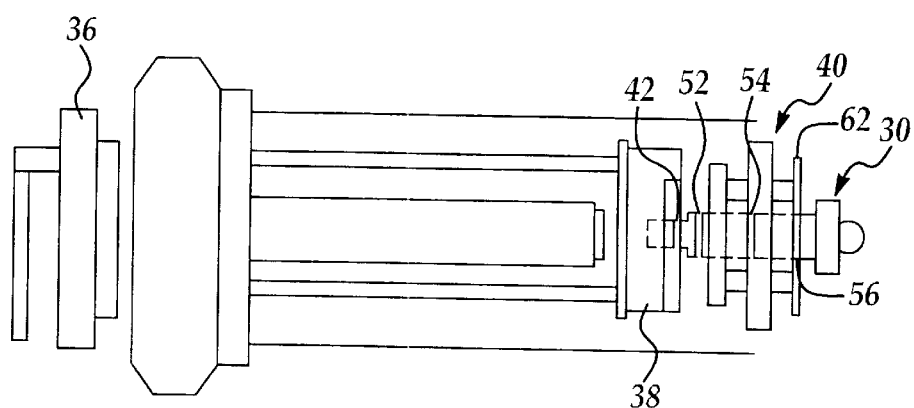
FIG. 5 is an illustration of the present invention method of aligning the slit openings of the arc chamber and the extraction electrode by the calibration tool.
Figure 6:
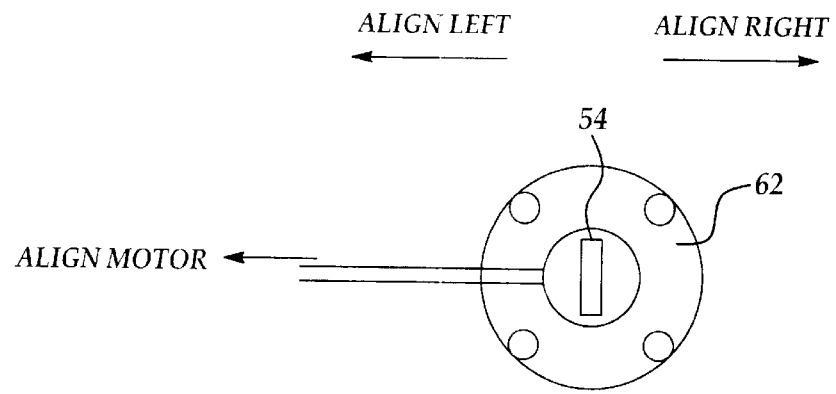
FIG. 6 is an end view of an aligned slit opening of an extraction electrode.

The insertion of the calibration tool 30 into a slit opening in an arc chamber and slit openings in an extraction electrode is shown in FIG. 5. Similarly, an illustration of a tilt motor 32, an alignment motor 34 and their actions in effecting a tilting motion of an extraction electrode 40 is shown in FIG. 4. It should be noted that the illustration shown in FIG. 4 is for illustrating the concept of tilting the extraction electrode 40. Any other suitable mechanical means for tilting the extraction electrode may also be utilized. It should be noted that the source head 36 includes the arc chamber 38 which is also equipped with a slit-opening 42, shown in FIG. 5. In the configuration shown in FIG. 4, in-between the arc chamber 38 and the center plate 44 of the extraction electrode 40 there is a negative voltage potential of 30 kV. While the front plate 46 and the back plate 48 are each positively charged and negatively charged, respectively. The negatively charged back plate 48 attracts ions from the slit opening 42 of the arch chamber 38. The front plate 46, the center plate 44 and the back plate 48 are each equipped with a slit opening 52,54 and 56, respectively. It should be noted that the tilt motor 32, alignment motor 34 are both controlled by a tilt/align controller 50. The alignment motor 34 allows the slit opening 54 to move horizontally, in a direction parallel to the around, as shown in FIG. 6. By utilizing the present invention novel calibration tool 30 by inserting into the slit openings 56,54 and 52 in the extraction electrode and the slit opening 42 in the arc chamber, as shown in FIG. 5, a simple procedure for the alignment of all slit openings is carried out. It should be noted that, the calibration tool shown in FIG. 5 has only two different width sections, instead of the three different width sections shown in FIG. 2.

Figure 7:
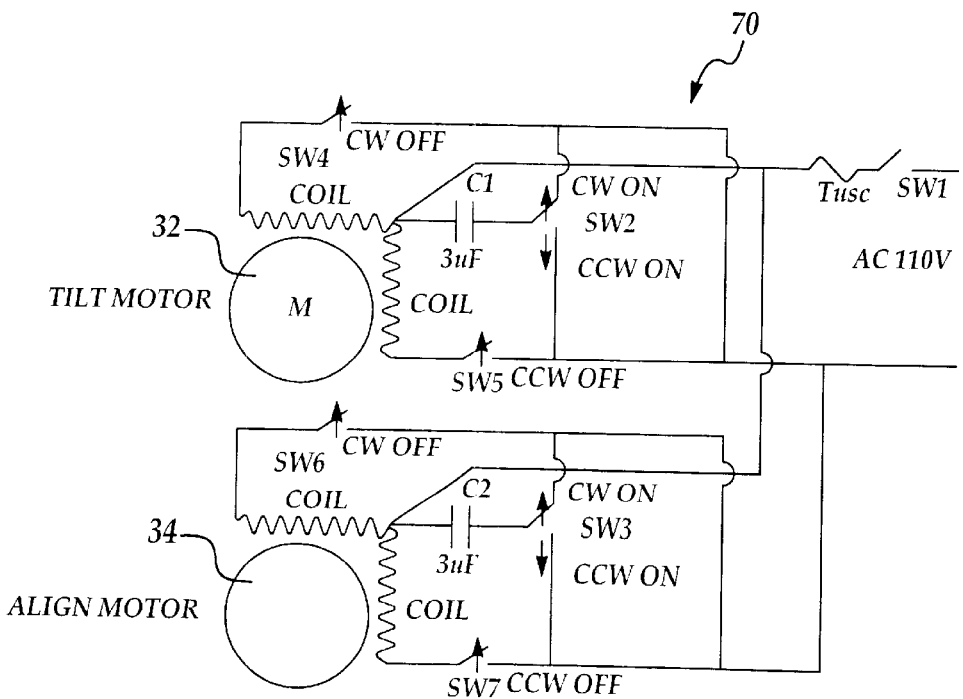
FIG. 7 is a circuit diagram illustrating the operation of the tilt motor and the alignment motor for aligning the extraction electrode to the arc chamber.

An electrical circuit 70 for the operation of the present invention tilt motor 32 and alignment motor 34 is shown in FIG. 7. In the circuit 70 for tilting and alignment, C1 and C2 are the starting capacitance. When the switch SW2 is turned to the CW (clockwise) position, the rotation of tilt motor 32 is clockwise. The clockwise motion continues until the switch SW4 is turned off, the tilt motor 32 stops rotation. When the switch SW2 is turned to CCW, the tilt motor 32 turns to a counter-clockwise direction. By turning off the switch of SW5, the tilt motor 32 stops. The operation of the alignment motor 34 is similar to that illustrated for the tilt motor 32.

According to the circuit of FIG. 7, it is therefore possible to control the tilt up/down and alignment left/right motions of the extraction electrode by the controller 50. By continuing to adjust the position of the slit openings of the arc chamber and the extraction electrode, until the calibration tool can be smoothly inserted into the slit openings of the two individual parts, the alignment between the arc chamber and the extraction electrode can be completed.

The present invention novel apparatus and method for aligning an extraction electrode to an arc chamber of an ion implantation apparatus have therefore been amply described in the above description and in the appended drawings of FIGS. 2–7.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for aligning an extraction electrode to an arc chamber of an ion implantation apparatus comprising the steps of:
    (A) providing a calibration tool in the shape of a flat key having at least two reducing, stepped widths from a base portion toward a tip portion of said key, said tip portion having a smaller width adapted for intimately engaging a slit opening in said arc chamber, said base portion having a larger width adapted for intimately engaging at least one slit opening in said extraction electrode;
    (B) tilting said extraction electrode by switching on a tilt motor;
    (C) moving said extraction electrode horizontally by switching on an alignment motor, said tilt motor and alignment motor are controlled by a tilt/align controller; and
    (D) inserting said calibration tool into said slit opening of said arc chamber through said slit opening of said extraction electrode, or repeating said steps B and C until such insertion is made.

2. A method for aligning an extraction electrode to an arc chamber of an ion implantation apparatus according to claim 1, wherein said at least one slit opening of said extraction electrode comprises at least two slit openings.

3. A method for aligning an extraction electrode to an arc chamber of an ion implantation apparatus according to claim 1, wherein said at least one slit opening of said extraction electrode comprises three slit openings.

4. A method for aligning an extraction electrode to an arc chamber of an ion implantation apparatus according to claim 1 further comprising the step of fabricating said calibration tool of a rigid plastic or metal.

5. A method for aligning an extraction electrode to an arc chamber of an ion implantation apparatus according to claim 1 further comprising the step of fabricating said calibration tool of aluminum.

6. A method for aligning an extraction electrode to an arc chamber of an ion implantation apparatus according to claim 1 further comprising the step of fabricating said calibration tool such that a width of a portion of the key is at least 0.3 mm smaller than a width of a corresponding slit opening that the portion of key is to be inserted.

7. A method for aligning an extraction electrode to an arc chamber of an ion implantation apparatus according to claim 1 further comprising the step of fabricating said calibration tool such a that a width of a portion of the key is about 0.5 mm smaller than a width of a corresponding slit opening that the portion of key is to be inserted.

8. A calibration tool for aligning an extraction electrode to an arc chamber of an ion implantation apparatus in combination with the ion implantation apparatus, said calibration tool apparatus comprising:

a body in the shape of a flat key having at least two reducing, stepped widths toward a tip portion of the key, said body further comprising:
a base portion having a larger width adapted for intimately engaging a slit opening in said extraction electrode, wherein said larger width of said base portion is at least 0.3 mm smaller than a width of a corresponding slit opening in said extraction electrode; and
the tip portion having a smaller width adapted for intimately engaging a slit opening in said arc chamber.

9. A calibration tool for aligning an extraction electrode to an arc chamber of an ion implantation apparatus according to claim 8, wherein said width of said base portion is about 0.5 mm smaller than said width of said corresponding slit opening in said extraction electrode.

10. A calibration tool for aligning an extraction electrode to an arc chamber of an ion implantation apparatus according to claim 8, wherein said width of said tip portion is at least 0.3 mm smaller than said width of said corresponding slit opening in said arc chamber.

11. A calibration tool for aligning an extraction electrode to an arc chamber of an ion implantation apparatus according to claim 8, wherein said width of said tip portion is about 0.5 mm smaller than said width of said corresponding slit opening in said arc chamber.

12. A calibration tool for aligning an extraction electrode to an arc chamber of an ion implantation apparatus according to claim 8, wherein said tool is fabricated of a rigid plastic or metal.

13. A calibration tool for aligning an extraction electrode to an arc chamber of an ion implantation apparatus according to claim 8, wherein said tool is fabricated of aluminum.

* * * * *